(12) United States Patent
Budelman

(10) Patent No.: US 6,717,246 B2
(45) Date of Patent: Apr. 6, 2004

(54) SEMICONDUCTOR PACKAGE WITH INTEGRATED CONICAL VAPOR CHAMBER

(75) Inventor: Gerald A. Budelman, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/123,930

(22) Filed: Apr. 16, 2002

(65) Prior Publication Data

US 2003/0197252 A1 Oct. 23, 2003

(51) Int. Cl.[7] ............................................... H01L 23/02
(52) U.S. Cl. ...................... 257/678; 257/687; 257/706; 257/707; 257/710; 257/722; 257/730
(58) Field of Search ................. 257/678, 687, 257/706, 707, 710, 722, 730

(56) References Cited

U.S. PATENT DOCUMENTS

| | | | | |
|---|---|---|---|---|
| 4,823,869 A | * | 4/1989 | Arnold et al. ............... | 165/185 |
| 5,653,813 A | * | 8/1997 | Benzing et al. ............. | 118/726 |
| 6,166,904 A | * | 12/2000 | Kitahara et al. ............ | 361/697 |
| 6,212,074 B1 | * | 4/2001 | Gonsalves et al. .......... | 361/717 |
| 6,331,730 B1 | * | 12/2001 | Terasaki et al. ............ | 257/688 |
| 6,369,595 B1 | * | 4/2002 | Farnworth et al. .......... | 324/755 |
| 6,469,379 B1 | * | 10/2002 | Matayabas, Jr. ............ | 257/706 |
| 6,535,388 B1 | * | 3/2003 | Garcia ........................ | 361/704 |

* cited by examiner

Primary Examiner—David Nelms
Assistant Examiner—Andy Huynh
(74) Attorney, Agent, or Firm—Paul E. Steiner

(57) ABSTRACT

A semiconductor package including a conical or pyramidal vapor chamber body coupled to a package bottom to enclose a vapor chamber within which are disposed a semiconductor die and working fluid. A matching conical or pyramidal heatsink is coupled to the vapor chamber body. The conical or pyramidal shape allows a tight fit and good thermal performance, without undue force being applied to the package bottom, and further allows a variety of heatsinks to be used with a standardized shape vapor chamber body.

34 Claims, 2 Drawing Sheets

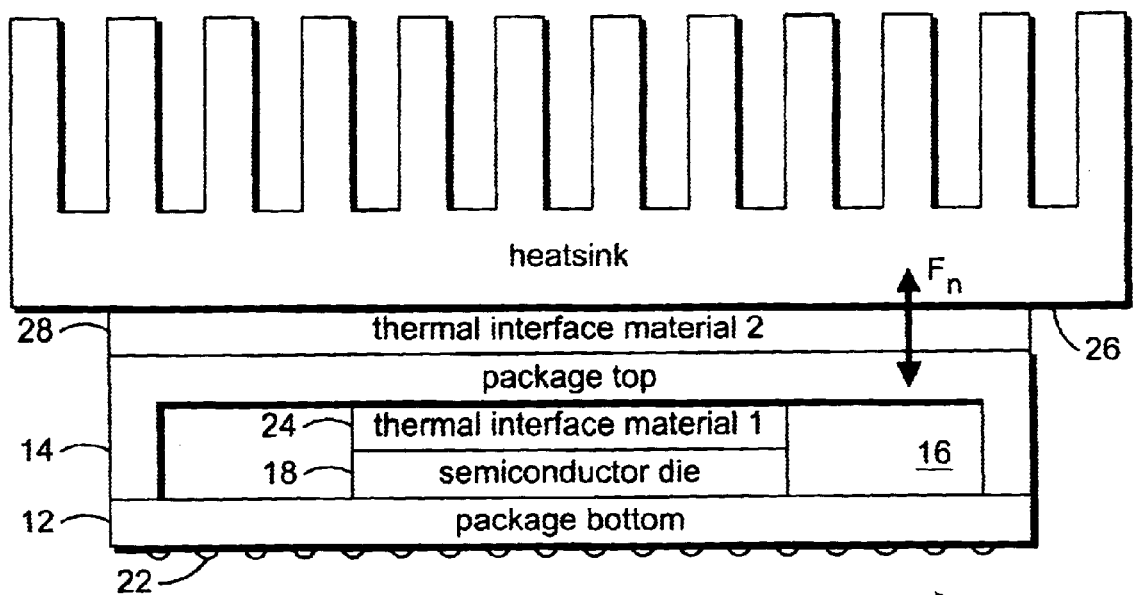
Fig. 1 - prior art
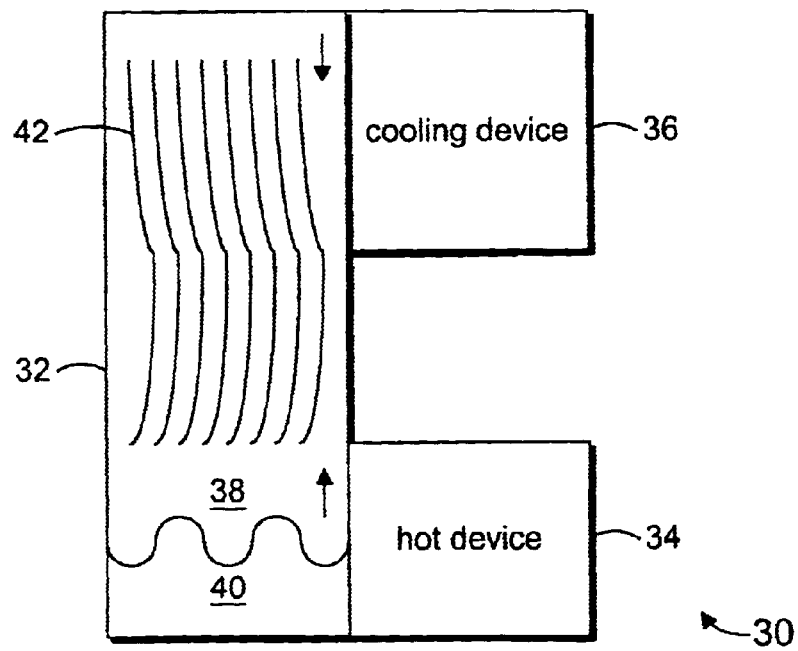
Fig. 2 - prior art

SEMICONDUCTOR PACKAGE WITH INTEGRATED CONICAL VAPOR CHAMBER

BACKGROUND OF THE INVENTION

1. Technical Field of the Invention

This invention relates generally to thermal solutions for semiconductor packaging, and more specifically to thermal solutions using a vapor chamber such as in heatpipes.

2. Background Art

Semiconductor packages presently rely upon a primarily conductive model for transmitting heat from the surface of the semiconductor die to the exterior of the package. This model includes a number of interfaces, each of which drives an increase in the thermal resistance of the package.

FIG. 1 illustrates a generalized semiconductor packaging system 10 such as is known in the prior art. The system includes a package having a package bottom 12 and a package top 14 or integrated heat spreader which encompass a cavity 16 within which a semiconductor die 18 is contained. The semiconductor die is electrically connected through the package bottom to a number of pins or contacts 22 on the exterior of the packaging system. The semiconductor die is thermally interfaced to the package top with a quantity of a first thermal interface material 24 which improves thermal transfer from the die to the interior surface of the package top. The exterior surface of the package top is thermally coupled to a heatsink 26 with a quantity of a second thermal interface material (TIM) 28. The reader will appreciate that this is a generalized and simplified view of the packaging system, for purposes of discussion.

Table 1 lists exemplary typical ratios of the various components of the aggregate thermal resistance of the system. Thermal resistance is measured in degrees Celsius per watt from the junction of the semiconductor device to the ambient air, in the case of an air-cooled system.

| Thermal Component | % of Resistance |
| --- | --- |
| Package | 49% |
| TIM 2 | 7% |
| Heatsink | 42% |
| Heatsink Variation | 2% |
| TOTAL | 100% |

In order to achieve good thermal contact across the second thermal interface layer 28, the heatsink is mechanically fastened to the package or to the computer chassis or motherboard (not shown), with strong springs or with bolts. This creates a large force (shown as Fn in FIG. 1) which is normal to the mating surfaces of the heatsink and the package top. This force is necessary to ensure a thin layer of TIM2 material with optimal thermal characteristics. However, this force can cause electrical and/or mechanical breakdown of the die, the package, connection to the package contacts, and so forth.

FIG. 2 illustrates a generalized, simplified heatpipe system 30 as is known in the prior art. The system includes a heatpipe 32 coupled to conduct heat from a hot device 34 to a cooling device 36. The body of the heatpipe encloses a vapor chamber 38 which contains a quantity of a working fluid 40 which does not completely fill the vapor chamber. The vapor chamber may also include a wicking material 42, which improves performance in configurations or orientations in which the working fluid is not held by gravity against the hot device end of the vapor chamber. As the hot device boils the working fluid, the working fluid vaporizes. As the vapor condenses elsewhere in the heatpipe nearer the cooling device, the significant amount of heat captured by the phase change is released, effecting an efficient thermal transfer from the hot end of the heatpipe to the cooler end. Any suitable cooling fluid can be used, such as water, alcohol, flourinert, or the like. Any suitable active or passive cooling device can be used, such as a heatsink, heat spreader, peltier device, refrigerator coil, or the like.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

FIG. 1 shows an exemplary semiconductor packaging and cooling system according to the FIG. 2 shows an exemplary heatpipe system according to the prior art.

DETAILED DESCRIPTION

Figure 3:
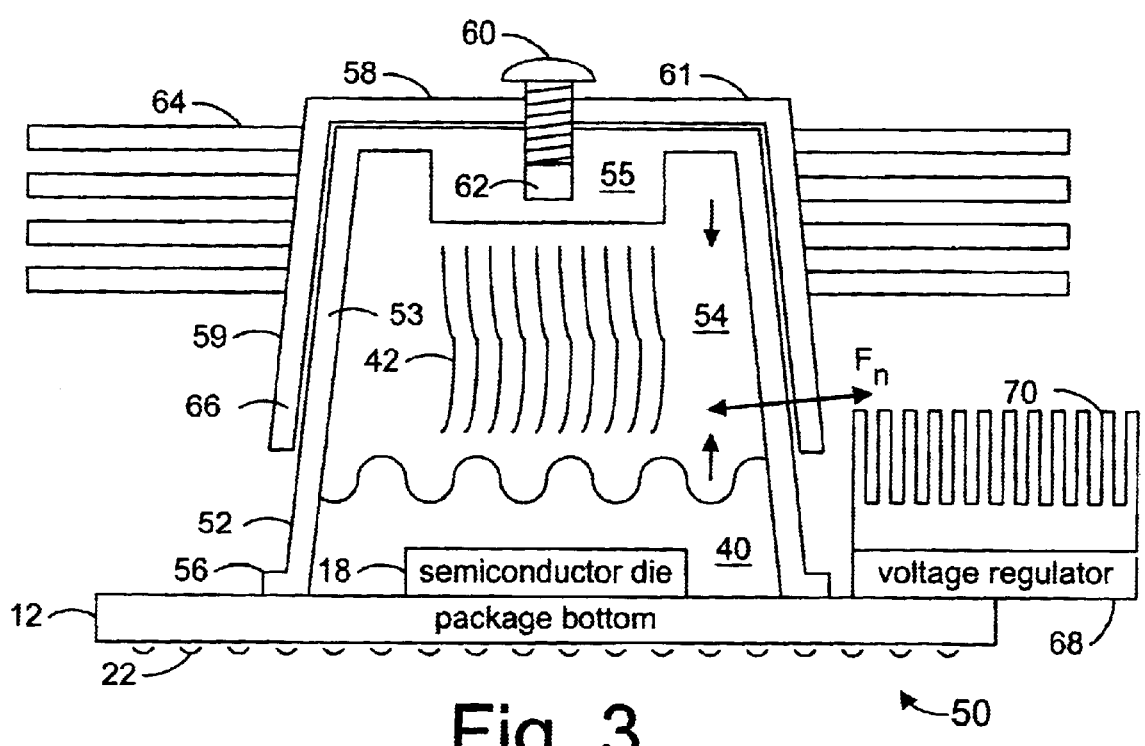
FIG. 3 shows one embodiment of a semiconductor packaging and cooling system according to this invention.

FIG. 3 shows, in cross-section, one exemplary embodiment of a system 50 utilizing the teachings of this invention. The system includes a semiconductor die 18 coupled to a package bottom which has electrical contacts 22.

A vapor chamber body 52 is sealed to the package to enclose a vapor chamber 54. The vapor chamber body includes a sidewall member 53 whose exterior surface has a substantially conical or pyramidal shape, which is wider at the open end (shown as being attached to the package body) than at the closed end (shown as the top end where the heatsink is attached). In the case of a pyramidal shape, the shape may include any suitable number of sides, each having any suitably flat or curved surface. In some embodiments, the overall shape is a truncated cone or pyramid, including a top member 55. In some embodiments, the top member and the sidewall member are one monolithic structure. In some embodiments, the sidewall member may have a lateral extension or lip 56 extending around parts or all of its perimeter at the open end, to provide increased sealing surface area for mating to the package.

The vapor chamber contains a quantity of suitable working fluid 40 and, optionally, a suitable wicking material 42. The semiconductor die may, in some cases, need to be suitably encapsulated so it does not come into e.g. direct electrical or chemical contact with the working fluid, while remaining in significantly direct thermal contact with the working fluid by being immersed therein (in configurations in which gravity holds the working fluid in the package end of the vapor chamber). The skilled reader will appreciate that the wicking material is to be appropriately placed within the chamber, such as by locating it along the inner surface of the chamber and extending onto or near to the semiconductor die. It is for ease of illustration only that the wick material is shown as residing in the central area of the chamber.

A heatsink 58 or other suitable cooling device is coupled to the exterior surface of the vapor chamber body by any suitable means, such as by a fastener 60 (such as a bolt, screw, rivet, or other means) which engages a threaded recess 62 in the upper portion of the vapor chamber body but does not compromise the seal of the vapor chamber. The heatsink may advantageously include a number of fins 64 or other structures for increasing its surface area. In one embodiment, these fins may extend laterally; in other embodiments, they may be differently oriented. In some embodiments, the fins may extend only partway along the heatsink, leaving a portion 66 without fins. This portion may be at the bottom of the heatsink as shown, or at any other suitable location, and its location may in part be determined by required keep-out zones in the system, such as if the package has one or more other devices coupled to it outside the vapor chamber body, for example an on-package voltage regulator 68 which may have its own heatsink 70. In some embodiments, these voids or finless portions may not be symmetrical around the vapor chamber body. In some embodiments, fins of differing length can be used to accommodate keep-out zones.

The portion of the heatsink that is not the fins may be termed the body of the heatsink. In one embodiment, the heatsink may be a monolithic structure, such as one formed by machining a block of metal. In other embodiments, the fins may be separate structures suitably affixed to the body of the heatsink, such as by brazing or by friction fit. In some such embodiments, the fins may be a set of plates having different diameter holes, such that they slip down a conical exterior surface of the heatsink to different positions, where they can be affixed.

The convex exterior surface of the vapor chamber body and the concave interior surface of the heatsink have substantially similar shapes and dimensions, such that they make good thermal contact with each other. The vapor chamber body may be considered a male structure and the heatsink may be considered a female structure; as shown in FIG. 3, the exterior surface of the vapor chamber body mates with the interior surface of the heatsink. This shape is generally conical or pyramidal, such that an upper portion of the vapor chamber body is narrower than a lower portion. This helps ensure a very close tolerance fit between the mating sides of the vapor chamber body and heatsink, thereby reducing the thermal resistance of a thermal interface material (not shown) between the heatsink and the vapor chamber body. The heatsink will simply slip down onto the vapor chamber body until the sides come into direct mechanical contact, as long as the top surface of the vapor chamber body does not contact the under side of the heatsink first. Additionally, the conical or pyramidal shape provides for a high normal force Fn between the mating surfaces, without creating a high force on the package, die, etc. This high normal force helps reduce the thermal resistance of the thermal interface material between the mating surfaces. Furthermore, because the die is not in a "mechanical stack" with the package top as in the prior art, mismatched thermal coefficients of expansion of the die and of the package top or integrated heat spreader will not cause mechanical stress on the die; the die is free to expand in the vapor chamber, and the heatsink is free to expand on top of the vapor chamber body, without physically impinging on the die. Moreover, since there is no direct contact between the vapor chamber and the die, the die may be thinned to bring the working fluid in closer proximity to the actual heat-generating transistors, which are typically located on the side of the die facing the package bottom. The die may also be machined to increase its effective surface area, to enhance the efficiency of the vapor generation (boiling) process. The vapor chamber heat spreader can, in some embodiments, have a reduced weight as compared to a more traditional solid copper base plate heatsink.

The generally conical shape of the chamber vessel facilitates easy removal of the heatsink. This allows customized heatsinks with a standard vapor chamber implementation.

Typically, the vapor chamber body may include a fill tube or other such mechanism through which the working fluid is injected. The size and placement of this mechanism, as well has how the chamber is evacuated and the fill mechanism sealed, are well within the ordinary skill of those in this field, and thus have been omitted from the drawings.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the invention. The various appearances "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An apparatus comprising:
   a package bottom;
   a vapor chamber body coupled to the package body to encompass a vapor chamber, wherein the vapor chamber body has an exterior surface with a shape which is one of a conical shape and a pyramidal shape; and
   a semiconductor die disposed within the vapor chamber.

2. The apparatus of claim 1 wherein the shape of the exterior surface of the vapor chamber body comprises a conical shape.

3. The apparatus of claim 1 further comprising:
   a heatsink coupled to the exterior surface of the vapor chamber body.

4. The apparatus of claim 3 wherein:
   the heatsink has an interior surface having a shape substantially similar to the shape of the exterior surface of the vapor chamber body.

5. The apparatus of claim 3 wherein:
   the exterior surface of the vapor chamber body and the interior surface of the heatsink each further comprises a truncated conical shape.

6. The apparatus of claim 5 wherein the heatsink comprises:
   a plurality of fins.

7. The apparatus of claim 6 wherein the fins extend only partway along the heatsink and the heatsink includes a portion without fins.

8. The apparatus of claim 7 further comprising:
   a device coupled to the package bottom outside the chamber body and adjacent the portion of the heatsink without fins.

9. The apparatus of claim 8 wherein the device comprises a voltage regulator.

10. The apparatus of claim 5 wherein:
a flat upper portion of the truncated cone of the vapor chamber body includes a recess;
a flat upper portion of the truncated cone of the heatsink includes a hole; and
the apparatus further comprises a fastener extending through the hole and into the recess to couple the heatsink to the vapor chamber body.

11. The apparatus of claim 1 further comprising:
working fluid disposed within the vapor chamber.

12. The apparatus of claim 11 further comprising:
wick material disposed within the vapor chamber.

13. A heatsink comprising:
a body having,
an exterior surface, and
a concave interior surface with a shape which comprises one of a conical shape and a pyramidal shape;
a plurality of fins in thermal contact with the exterior surface.

14. The heatsink of claim 13 wherein:
the shape of the concave interior surface further comprises a truncated conical shape including a top surface; and
the top surface includes a hole through the heatsink from the exterior surface to the interior surface.

15. The heatsink of claim 13 wherein the body and the plurality of fins comprise a monolithic structure.

16. The heatsink of claim 13 wherein the plurality of fins comprise separate structures affixed to the body.

17. The heatsink of claim 13 wherein a portion of the body does not have fins.

18. The heatsink of claim 17 wherein the portion of the body which does not have fins comprises a lower portion of the heatsink.

19. A vapor chamber body comprising:
a sidewall member having an exterior shape;
wherein the exterior shape is one of,
a conical shape, and
a pyramidal shape; and
the sidewall member has an open end at a large end of the exterior shape.

20. The vapor chamber body of claim 19 further comprising:
a top member coupled to the sidewall member at an end opposite the open end.

21. The vapor chamber body of claim 20 wherein the sidewall member and the top member are of integral, monolithic construction.

22. The vapor chamber body of claim 21 further comprising:
a lip at the open end of the exterior shape.

23. The vapor chamber body of claim 21 further comprising:
a recess in the top member which does not extend all the way through the top member.

24. The vapor chamber body of claim 23 wherein the recess is threaded.

25. An apparatus comprising:
a package bottom;
a semiconductor die coupled to the package bottom;
a conical vapor chamber body coupled to the package bottom to enclose a vapor chamber within which the semiconductor die is disposed;
working fluid disposed within the vapor chamber; and
a conical heatsink coupled to the conical vapor chamber body.

26. The apparatus of claim 25 further comprising:
a device coupled to the package bottom on a same side of the package bottom as the conical vapor chamber body and outside the vapor chamber.

27. The apparatus of claim 26 wherein the device comprises:
a voltage regulator.

28. The apparatus of claim 27 wherein the device further comprising:
a voltage regulator heatsink coupled to the voltage regulator.

29. The apparatus of claim 26 wherein:
the conical heatsink includes a plurality of fins,
the conical heatsink includes a portion which has no fins; and
the device is adjacent the portion which has no fins.

30. The apparatus of claim 25 wherein the working fluid is in direct contact with the semiconductor die.

31. The apparatus of claim 25 further comprising:
wick material disposed within the vapor chamber and in direct contact with the working fluid.

32. The apparatus of claim 31 wherein the wick material is also in direct contact with the vapor chamber body.

33. The apparatus of claim 25 further comprising:
thermal interface material between the conical heatsink and the conical vapor chamber body.

34. The apparatus of claim 33 further comprising:
a fastener coupling the heatsink to the vapor chamber body.

* * * * *

UNITED STATES PATENT AND TRADEMARK OFFICE
CERTIFICATE OF CORRECTION

PATENT NO. : 6,717,246 B2 Page 1 of 1
APPLICATION NO. : 10/123930
DATED : April 6, 2004
INVENTOR(S) : Budelman It is certified that error appears in the above-identified patent and that said Letters Patent is hereby corrected as shown below:

In column 2, at line 22 after "the", insert --prior art--.

In column 2, at line 33 after "bottom", insert --12--.

Signed and Sealed this

Twenty-second Day of January, 2008

JON W. DUDAS
*Director of the United States Patent and Trademark Office*